(12) United States Patent
Adams et al.

(10) Patent No.: US 7,168,005 B2
(45) Date of Patent: Jan. 23, 2007

(54) PROGRAMABLE MULTI-PORT MEMORY BIST WITH COMPACT MICROCODE

(75) Inventors: R. Dean Adams, St. George, VT (US); Thomas J. Eckenrode, Endicott, NY (US); Steven L. Gregor, Endicott, NY (US); Kamran Zarrineh, Vestal, NY (US)

(73) Assignee: Cadence Design Systems, Inc., San Jose, CA (US)

( * ) Notice: Subject to any disclaimer, the term of this patent is extended or adjusted under 35 U.S.C. 154(b) by 684 days.

(21) Appl. No.: 10/354,535

(22) Filed: Jan. 30, 2003

(65) Prior Publication Data

US 2003/0120974 A1  Jun. 26, 2003

(51) Int. Cl.
*G06F 11/00* (2006.01)

(52) U.S. Cl. .......................... 714/31; 714/733
(58) Field of Classification Search ................ 714/31, 714/733, 30
See application file for complete search history.

(56) References Cited

U.S. PATENT DOCUMENTS

| | | | |
|---|---|---|---|
| 4,674,089 A | 6/1987 | Poret et al. | |
| 5,073,891 A | 12/1991 | Patel | |
| 5,633,877 A * | 5/1997 | Shephard et al. | 714/725 |
| 5,734,613 A | 3/1998 | Gibson | |
| 5,742,557 A | 4/1998 | Gibson et al. | |
| 5,764,655 A | 6/1998 | Kirihata et al. | |
| 5,790,564 A | 8/1998 | Adams et al. | |
| 5,796,745 A * | 8/1998 | Adams et al. | 714/718 |
| 5,812,469 A | 9/1998 | Nadeau-Dostie et al. | |
| 5,878,051 A | 3/1999 | Sharma et al. | |
| 5,896,330 A | 4/1999 | Gibson | |
| 5,897,609 A | 4/1999 | Choi et al. | |
| 5,912,850 A | 6/1999 | Wood et al. | |
| 5,951,678 A | 9/1999 | Moyer | |
| 5,961,653 A | 10/1999 | Kalter et al. | |
| 6,032,274 A | 2/2000 | Manning | |
| 6,070,256 A * | 5/2000 | Wu et al. | 714/718 |
| 6,216,241 B1 * | 4/2001 | Fenstermaker et al. | 714/718 |
| 6,311,298 B1 | 10/2001 | Norrie | |

* cited by examiner

*Primary Examiner*—Dieu-Minh Le
(74) *Attorney, Agent, or Firm*—Orrick Herrington & Sutcliffe LLP

(57) ABSTRACT

A microcode programmable built-in-self-test (BIST) circuit and method for testing a multiported memory via multiple ports, either simultaneously or sequentially, as directed by a microcode instruction word. The microcode instruction word contains a plurality of executable subinstructions and one bit of information that controls whether the test operations prescribed in the plurality of subinstructions shall be executed in parallel or in series. The executable subinstructions are dispatched by a primary controller to subcontrollers which perform test operations at each port according to the subinstructions. The microcode programable BIST architecture flexibly facilitates the testing of multiple devices, multiported devices, including multiported memory structures and complex dependent multiported memory structures. The BIST supports in-situ testing of the functionality of the memory at wafer, module, and burn-in, as well as system-level testing.

41 Claims, 11 Drawing Sheets

| EXAMPLE OF SERIAL INST. | LINE# | 400 | 401 | 402 | 403 | 404 (n=4) |
|---|---|---|---|---|---|---|
| W0's INC <0> [1] | (1) | 100100100111 | 010100000 | 000000000 | 000000000 | 000000000 |
| R0, W1, R1, W1, INC | (2) | 100100110011 | 100000000 | 010000011 | 100100011 | 010100011 |
| R1, W0, R0, W0, INC | (3) | 100100110011 | 100000011 | 010000000 | 100100000 | 010100000 |
| R0, W1, R1, W1, DEC | (4) | 100100110011 | 100000000 | 010000011 | 101000011 | 011000011 |
| R1, W0, R0, W0, — | (5) | 100100110011 | 100000000 | 010000000 | 101000000 | 011000000 |
| R0's DEC | (6) | 100100100111 | 101000000 | 000000000 | 000000000 | 000000000 |
| EXAMPLE OF PARALLEL INST. | | | | | | |
| W01 INC <0> [1]+ | (7) | 100000100111 | 010100001 | 000000000 | 000000000 | 000000000 |
| R10 <PORT 0> — R01 <1> + | (8) | 100000101011 | 101000010 | 100100101 | 000000000 | 000000000 |

PROGRAMABLE MULTI-PORT MEMORY BIST WITH COMPACT MICROCODE

BACKGROUND OF THE INVENTION

1. Technical Field

The invention relates generally to testing of integrated circuits, and more specifically to built-in-self-test (BIST) circuits and methods implementable on an integrated circuit chip for testing the integrated circuit having a multi-ported memory array.

2. Related Art

Advances in computer technology have led to a development of multi-processor computers having multi-ported memory devices. Such memory devices can have fault modes, such as typical cell faults (e.g., stuck-at, transition, coupling, etc.) which must be tested for and detected early in the production process before the memory devices are installed, since the faults can cause the failure of the computers or other electronic structures that the memory devices are intended to be used with.

The testing of memory may be performed by an external tester, such as a piece of automatic test equipment (ATE), or may be performed internally in the memory device. Internal testing is referred to as built-in self-test (BIST), which may be used in conjunction with deterministic test algorithms. The most popular and widely accepted deterministic test algorithm is known as a MARCH algorithm. BIST algorithms include a MARCH algorithm. See A. J. van de Goor, Testing Semiconductor Memories: Theory and Practice, John Wiley & Sons Ltd., England, 1991; B. Nadeau-Dostie, A. Silburt and V. K. Agarwal, "Serial Interfacing for Embedded Memory Testing," IEEE Design and Test of Computers, April 1990, p. 52.

The types of tests required for a large multiported memory are quite complex, and may vary depending upon external parameters such as temperature and operating voltage, and therefore a flexible BIST is required. The flexible nature of the BIST disclosed in U.S. Pat. No. 5,961,653, issued to Kalter, et al., and assigned to International Business Machines Corp., aids in the implementation of some single-port access tests.

Previously, multiport memory BISTs have been designed for single-ported memory structures and multi-ported memories using finite state machines (FSM) to implement memory testing algorithms. See FIG. 1a and FIG. 1b. An FSM executes a predetermined set of patterns (e.g., write and read operations) with little or no flexibility. A typical FSM BIST is custom designed for a given memory and a predefined set of tests. Any new test for a memory requires a new FSM BIST design, which may require a redesign of the entire integrated circuit.

In a typical memory BIST employing a finite state machine (FSM) such as the FSM BIST 111 in FIG. 1a and the FSM BIST 112 in FIG. 1b, the data patterns, address sequencing, and control sequence that will be run for every test are fixed in the BIST logic implemented in hardware. This technique is generally inadequate for testing DRAMs because of the inflexibility of the BIST logic to cover the data pattern, address sequencing, and control sensitivities which can be process or parametric dependent and which can change with time (e.g., after manufacture of the integrated circuit).

There is a need for a programable BIST circuit that will perform robust testing of multiported memories, including a need for a BIST having a high degree of flexibility in address sequencing, data patterns, and control signals for effectively testing multiported memories. Additionally, there is a need for an optimally effective and economical BIST circuit to detect faulty designs and units early in the production process, or whenever, (e.g., during or after production), a new fault mode is discovered.

SUMMARY OF THE INVENTION

The present invention provides a programmable built-in-self-test (BIST) circuit and method for testing a memory via multiple (i.e., N) ports, either simultaneously or sequentially, as directed by a microcode word containing a plurality of subinstructions. The inventive programmable memory BIST architecture flexibly facilitates the testing of multiported devices and multiported memory structures, including complex multiported memory structures. The inventive BIST supports in-situ testing of the memory at wafer, module, and burn-in stages, as well at a system level. The present invention provides a BIST with a high degree of flexibility in address sequencing, data patterns, and control signals for effectively testing multiported memories.

The inventive microcode instruction word structure and method implements a BIST primary controller and multiple subcontrollers capable of performing two or more test operations either in series or in parallel at multiple ports. Specification of multiple test operations within a small instruction facilitates execution of a large number of tests efficiently on a multiported memory.

Accordingly, a first aspect of the invention provides an apparatus for testing a device having a plurality of ports, the apparatus comprising:

a plurality of subcontrollers, each subcontroller being adapted to execute a subinstruction of a plurality of subinstructions, each subinstruction directing a performance of at least one operation at one port of the plurality of ports; and a primary controller coupled to the plurality of subcontrollers, the primary controller being adapted to dispatch the plurality of subinstructions to the plurality of subcontrollers.

A second aspect of the invention provides a digital system, comprising:

a device having a plurality of ports;

a digital processor coupled to the device; and an apparatus for testing the device, said apparatus comprising:

a plurality of subcontrollers, said plurality of subcontrollers coupled to the device, each subcontroller being adapted to execute a subinstruction of a plurality of subinstructions, each subinstruction directing a performance of at least one operation at one port of the plurality of ports; and a primary controller coupled to the plurality of subcontrollers, the primary controller being adapted to dispatch the plurality of subinstructions to the plurality of subcontrollers.

A third aspect of the invention provides a method for testing a device having a plurality of ports, comprising the steps of:

providing a plurality of subcontrollers;

coupling a primary controller to the plurality of subcontrollers;

coupling the plurality of subcontrollers to the plurality of ports of the device;

dispatching by the primary controller a plurality of subinstructions to the plurality of subcontrollers; and executing by the plurality of subcontrollers the plurality of subinstructions, each subinstruction directing a performance of at least one operation at one port of the plurality of ports.

A fourth aspect of the invention provides a method for testing a device coupled to a digital processor, comprising the steps of:

providing the device coupled to the digital processor, said device having a plurality of ports;

coupling a plurality of subcontrollers to the device;

coupling a primary controller to the plurality of ports of the device;

dispatching by the primary controller a plurality of subinstructions to the plurality of subcontrollers; and executing by the plurality of subcontrollers the plurality of subinstructions, each subinstruction directing a performance of at least one operation at one port of the plurality of ports.

BRIEF DESCRIPTION OF THE DRAWINGS

The exemplary embodiments of the present invention will hereinafter be described in conjunction with the appended drawings, where like designations denote like elements, and:

FIG. 4b illustrates eight exemplary microcode instruction words in accordance with embodiments of the standard-type instruction of FIG. 4a.

DETAILED DESCRIPTION

The detailed description herein is presented in two parts. The first part describes embodiments of a testing apparatus and associated instruction management for testing a memory device (or devices) having multiple ports, in accordance with embodiments of the present invention. The second part describes methods, structures, and formats of instructions which may be used with the testing apparatus of the present invention.

Testing Apparatus and Associated Instruction Management

Figure 1A:
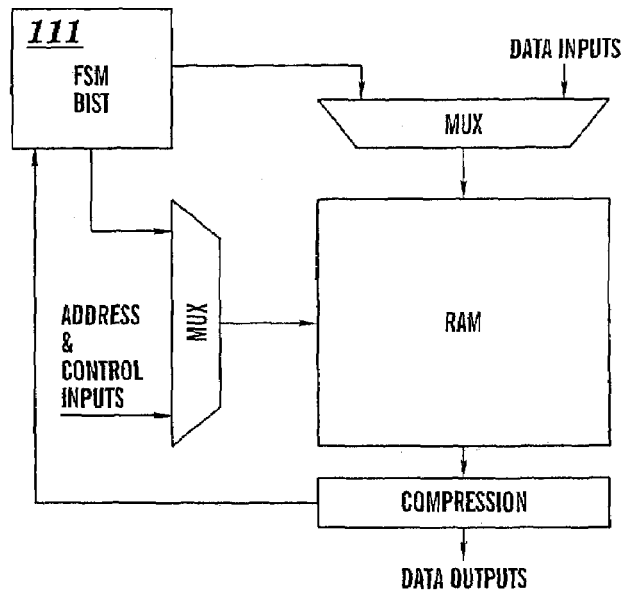
FIG. 1a is a block diagram illustrating a Finite State Machine (FSM)-based BIST circuit of the related art for a single-port memory.
Figure 1B:
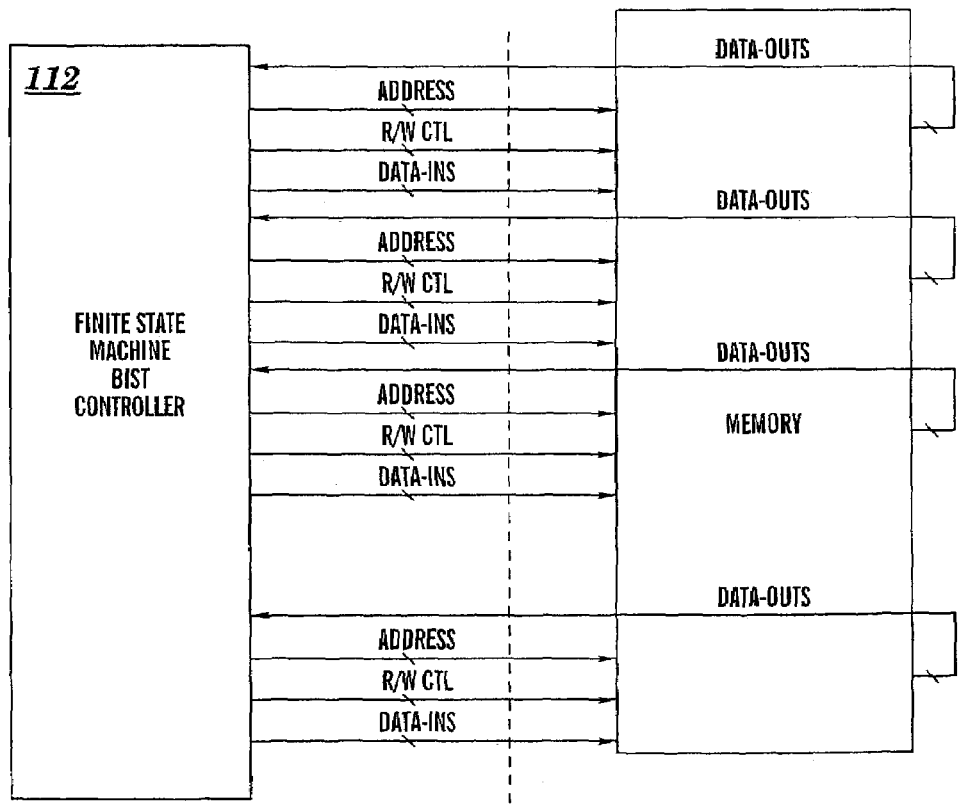
FIG. 1b is a block diagram illustrating a Finite State Machine (FSM)-based BIST circuit of the related art for a multiported memory.
Figure 2A:
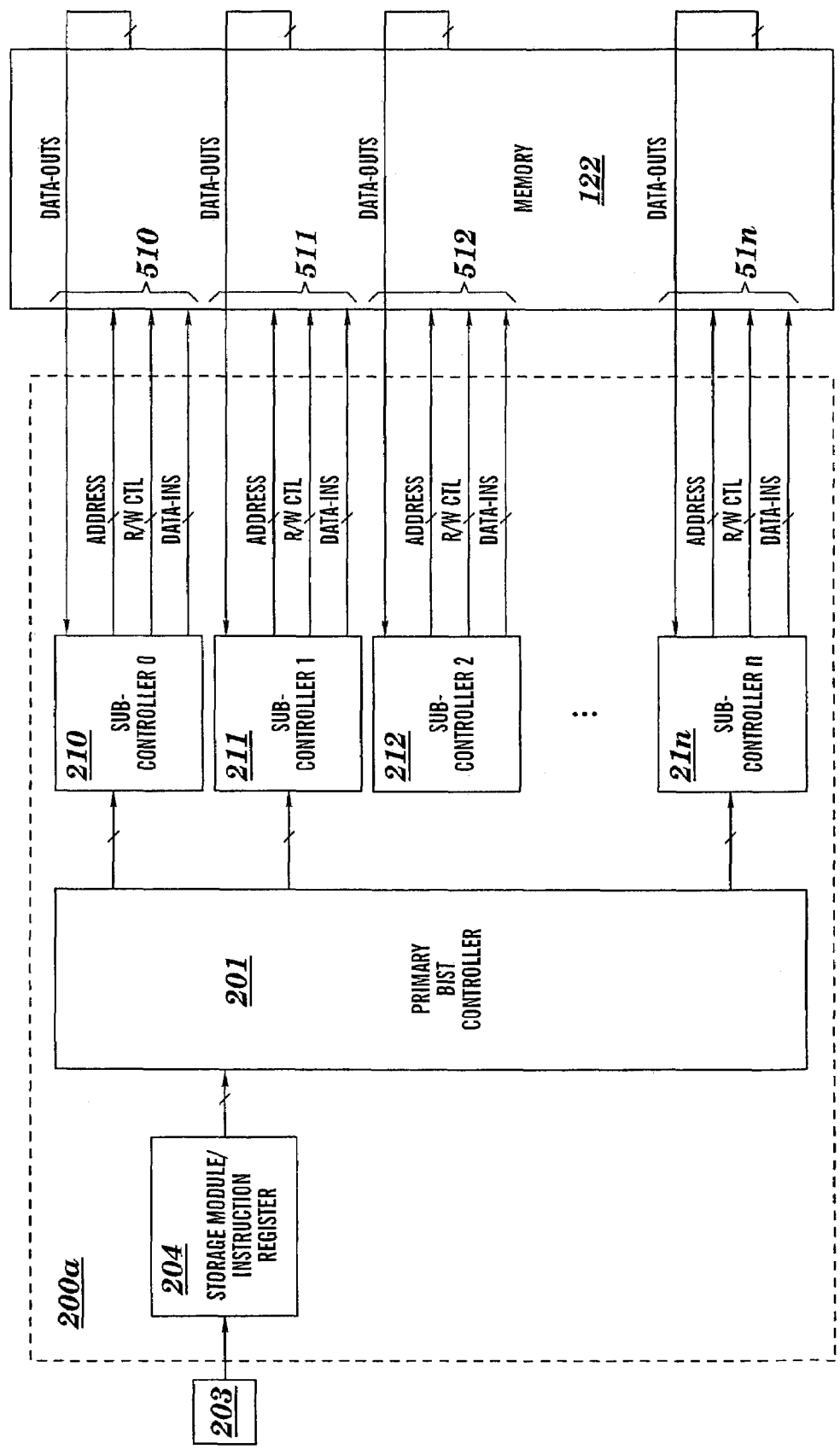
FIG. 2a is a block diagram illustrating a Built-In-Self-Test (BIST) testing apparatus that includes a primary controller and subcontrollers for testing for faults in an N-ported memory device via its multiple (i.e., N) ports, in accordance with embodiments of the present invention.

FIG. 2a is a block diagram illustrating an inventive microcode-programable built-in-self-test (BIST) system for testing a multiported memory device 122 having N ports (510, 511, . . . , 51n); i.e., N=n+1. Accordingly, FIG. 2a depicts a BIST testing apparatus 200a for testing for faults (i.e., defects) in a memory device 122 via N ports (510, 511, . . . , 51n), in accordance with embodiments of the present invention. The device 122 may be, inter alia, a memory device, or any other device having a plurality of digital interfaces. As shown, the memory device 122 has "N" ports (wherein N is an integer), namely ports 510, 511, . . . , 51n, wherein "n" is a positive integer equal to N−1 such that the port 51n represents the port 510+n. For example, if n were 13, then the port 51n would represent the port 523 and the memory device 122 would have 14 ports (i.e., N=14), namely ports 510–523. Each port may have particular characteristics independent of characteristics of the other ports. For example, some ports may be read-only ports, other ports may be write-only ports, and still other ports may be enable to both read or write.

The memory device 122 comprises M memory addresses denoted as $A_1$, $A_2$, . . . , $A_M$. The testing apparatus 200a facilitates testing for the existence of faults associated with the M memory addresses (i.e., the M memory addresses $A_1$, $A_2$, . . . , $A_M$) and/or the N ports (i.e., the N ports 510, 511, . . ., 51n) of the memory device 122. Testing for faults may include, inter alia: writing a given sequence of binary bits into the memory address of the M memory addresses via one port of the N ports, reading (via one or more ports) the binary bits that had been stored in the given memory addresses as a result of the aforementioned writing of the sequence of binary bits, and determining (such as by comparison) whether the sequence of binary bits thus read differ from the given sequence binary bits. The aforementioned method of testing for faults may be repeated for other ports of the N ports. Appendix A herein presents a more detailed discussion of exemplary fault modes and memory test algorithms in relation to the present invention.

The testing apparatus 200a includes an instruction storage module 204, a primary controller 201 (e.g. a built-in-self-test (BIST) controller), and N subcontrollers 210, 211, . . . , 21n, wherein n is the positive integer defined supra in conjunction with the N ports. The instruction storage module 204 stores "instructions" in, inter alia, a data buffer, a register array, or a small memory such as a Read-Only-Memory (ROM, EPROM etc.) or a Random-Access-Memory (RAM). An instruction, which may be contained in a word of binary bits, includes information that determines how the device 122 and its ports 510, 511, . . . , 51n are to be tested. The instructions may be provided to the instruction storage module 204 from an external source 203 (e.g., an external tester or an external memory device such as a RAM or ROM). Alternatively, the instructions may be transferred to the instruction storage module 204 from devices within the primary controller 201; i.e., from an initialization module 232 as will be discussed infra in conjunction with FIG. 2c. Exemplary methods, structures, and formats of instructions which may be used with the testing apparatus 200a will described in detail infra in the "Instruction Methods, Structures, and Formats" part of this Detailed Description.

The primary controller 201 of the testing apparatus 200a is capable of receiving instructions from the instruction storage module 204. The primary controller 201 is coupled to the N subcontrollers 210, 211, . . . , 21n. The primary controller 201 is capable of transferring a portion of an instruction, called a "subinstruction," to a subcontroller. A subinstruction may include information that designates the particular port to be accessed and that specifies other details of how the memory device 122 is to be tested. Additionally, the primary controller 201 is capable of asserting control signals to the N subcontrollers 210, 211, . . . , 21n, for any control purpose such as, inter alia, commanding a subcontroller: to execute a subinstruction, to delay execution of a subinstruction, or to provide feedback as to the results of executing a subinstruction. A subcontroller may execute a new subinstruction received from the primary controller 201 after completion of execution of the current subinstruction. A new subinstruction may be issued to a subcontroller from the primary controller 201, either after the subcontroller has executed a prior subinstruction (i.e., after the terminating condition for the executing subinstruction has been satisfied), or where a buffer is provided, before the previous subinstruction has been completely executed.

Each of the subcontrollers may be coupled simply to a single specific port or each may be multiplexed such that any subcontroller can access any port; i.e., the subcontroller $21j$ is capable of generating and passing data and control signals to, and receiving data and control signals from, the port $51k$ (j=0, 1, 2, . . . , n) (k=0, 1, 2, . . . , n). The data signals include test data for testing memory device 122 and the port $51k$, as specified in a subinstruction being processed. The control signals include signals that set states of internal circuits of the memory device 122 as well as write/read enable signals, and address signals for the memory device 122. Accordingly, data and control signals may include, inter alia, memory addresses, write/read controls, and binary data bits, which are transmitted to the port $51k$ through port interfaces shown in FIG. 2a as "Address," "R/W Ctl," and "Data-ins," and "Data-Outs." Although FIG. 2a shows separate lines for Data-in and Data-out at each port interface, some ports may be read-only ports, and therefore support only Data-Out lines such that there would be no Data-Ins. Similarly, some ports may be write-only ports and therefore support only Data-in lines such that there would be no Data-Outs.

The instruction storage module 204 holds instructions and passes the instructions sequentially to the primary controller 201. The primary controller 201 manages the flow and execution of said instructions. In particular, the primary controller 201 parses each instruction into its logical components, namely into a preinstruction and a plurality of the port-specific subinstructions (i.e., each subinstruction specifies write/read operations to be performed at one port of the N ports 510, 511, . . . , 51n).

For a representative subinstruction that specifies particular write/read operations (e.g., writing and reading a given sequence of binary bits such as 010101. . . ) in and out of the memory device 122 though the port $51k$ (k=0, 1, . . . , n), the primary controller 201 transfers the representative subinstruction to the subcontroller $21j$ of the subcontrollers 210, 211, . . . , 21n, since the subcontroller $21j$ is coupled to the port $51k$ and is thus capable of transferring data to and from the port $51k$. The subcontroller $21j$ executes the representative subinstruction by executing the operations (e.g., the write and/or read operations) specified in the representative subinstruction. The operations specified in a subinstruction are performed through the port $51k$ at some or all of the M memory addresses $A_1, A_2, \ldots, A_M$ of the device 122.

When the subcontroller $21j$ performs a read operation specified in the representative subinstruction, the testing apparatus 200a (for example, by an operation of the subcontroller) makes a determination of whether a fault condition exists in the memory device 122, such as by comparing the data read from the memory device 122 with the expected data (e.g., previously written into the memory device 122).

Figure 2B:
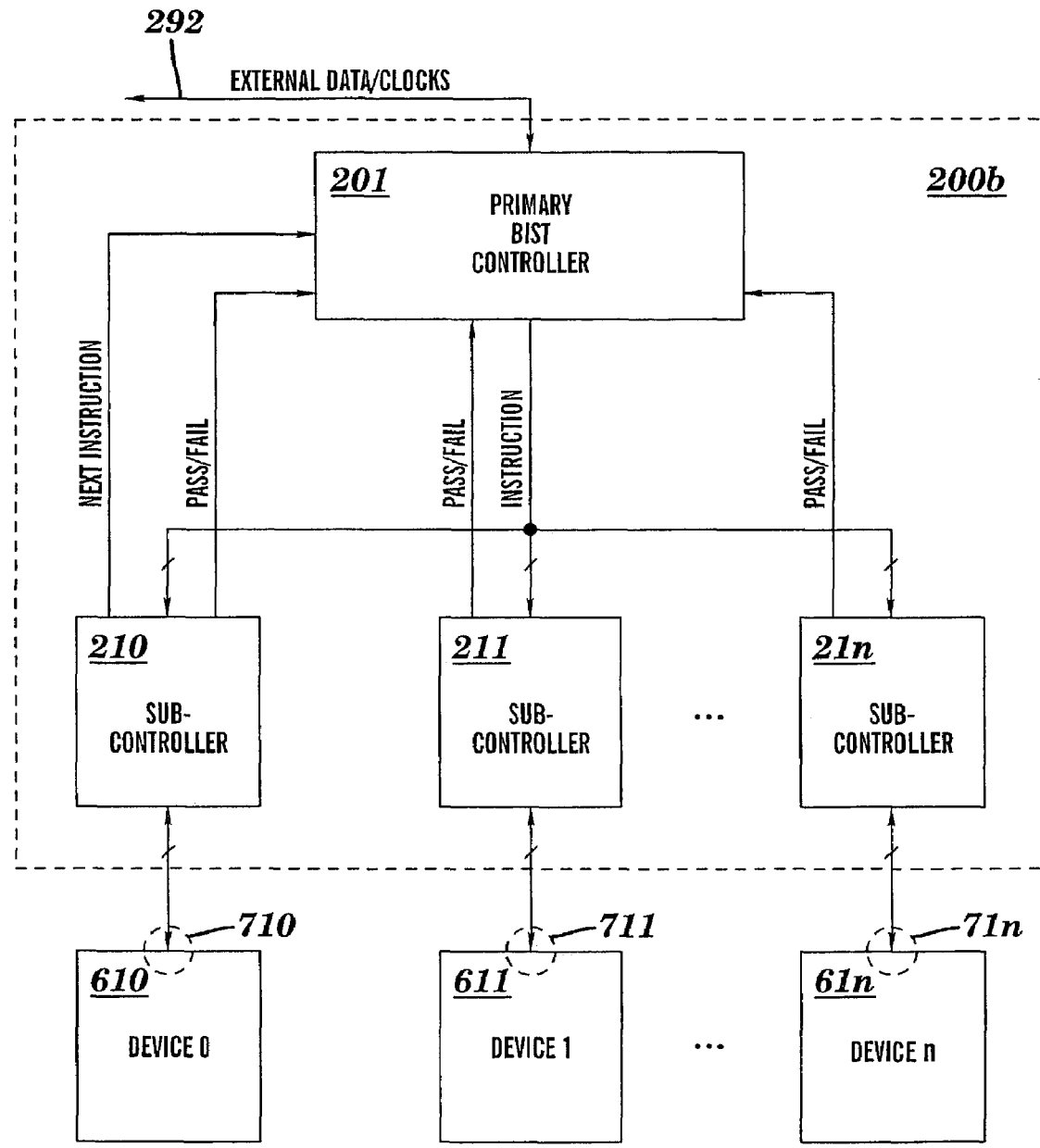
FIG. 2b is a block diagram illustrating a BIST testing apparatus for fault testing of N devices via N ports, in accordance with embodiments of the present invention.

The testing apparatus 200a may be configured to allow feedback of detected fault conditions from the N subcontrollers 210, 211, . . . , 21n to the primary controller 201, as is depicted in FIG. 2b. With such feedback, the subcontrollers 210, 211, . . . , 21n would each communicate to the primary controller 201 that faults have been discovered.

The preinstruction of a given instruction includes port-independent information concerning the testing of the memory device 122. The primary controller 201 executes the preinstruction. The preinstruction may specify whether the subinstructions of the instruction are to be processed serially or in parallel (i.e., concurrently), which in turn prompts the primary controller 201 to cause serial or parallel execution of the subinstructions.

The primary controller 201 may effectuate parallel execution of the pertinent subinstructions by controlling the timing of the execution of the pertinent subinstructions by the subcontrollers. This may be accomplished by transmitting (simultaneously or as speedily as the hardware of the testing apparatus 200a permits) the pertinent subinstructions to the pertinent subcontrollers and thereafter simultaneously enabling the pertinent subcontrollers to execute the pertinent subinstructions.

For parallel execution of subinstructions at a plurality of ports, software may be provided to the user to warn against the inadvertent occurrence of port access conflicts. Software or hardware for resolving port-access and control conflicts may be provided. For example, if two or more subinstructions shall specify write operations to the same port or to the same address, the prioritization or serialization of execution of said two or more subinstructions may be logically necessary. Conflict detection and arbitration may be handled by software or by hardware.

As an example, the memory device 122 is assumed to have 9 ports (i.e., n=8) and an example instruction includes 3 executable subinstructions, namely a first subinstruction that designates first operations for the port 513, a second subinstruction that designates second operations for the port 517, and a third subinstruction that designates third operations for the port 511. The preinstruction of the example instruction specifies serial execution of the subinstructions. After receiving the example instruction from the instruction module 204, the primary controller 201 parses the example instruction into the preinstruction and the 3 subinstructions. Then the primary controller 201 effectuates serial execution of the first subinstruction, the second subinstruction, and the third subinstruction as follows:

First, the primary controller 201 transfers the first subinstruction to the subcontroller 213, transfers the second subinstruction to the subcontroller 217, and transfers the third subinstruction to the subcontroller 211.

Second, the subcontroller 213 executes at least one instance of the first operations on the memory device 122 through the port 513, including detecting any faults in the memory device 122 or the port 513.

Third, the subcontroller 217 executes the at least one instance of the second operations on the memory device 122 through the port 517, including determining whether there are any faults in the memory device 122 or the port 517.

Fourth, the subcontroller 211 executes at least one instance of the third operations on the memory device 122 through the port 511, including determining whether there are any faults in the memory device 122 or the port 511.

If the preinstruction had specified parallel execution of the subinstructions instead of the serial execution, then the primary controller 201 would implement parallel (simultaneous) execution of at least one instance of the first operations, at least one instance of the second operations, and at least one instance of the third operations. If the primary controller 201 hardware permits, then the primary controller 201 may concurrently transfer the first subinstruction to the subcontroller 213, the second subinstruction to the subcontroller 217, and the third subinstruction to the subcontroller 211. The primary controller 201 would instruct, or otherwise enable, the subcontrollers 213, 217, and 211 to immediately process the first subinstruction, the second subinstruction, and third subinstruction, respectively.

If the primary controller 201 hardware does not so permit, then the primary controller 201 may transfer a first subinstruction to a first subcontroller (e.g., 213), then transfer a second subinstruction to a second subcontroller (e.g., 217) without waiting for completion of execution of the first subinstruction.

While FIG. 2a shows a one-to-one coupling of the subcontrollers 210, 211, . . . , 21n to the ports 510, 511, . . . , 51n (i.e., the subcontroller 21j is coupled to, and only to, the port 51k for k=0, 1, 2, . . . , n), any other viable coupling and/or multiplexing between the subcontrollers and the ports are within the scope of the present invention. For example, some or all of the subcontrollers may be coupled in any manner known to one of ordinary skill in the art (e.g., by use of multiplexers) to more than one port such as to all of the ports. A subcontroller that is coupled to more than one port may be more flexibly utilized for executing subinstructions than a subcontroller that is coupled to only one port. If all of the subcontrollers are coupled to all of the ports, then the primary controller 201 would be able to manage the processing of subinstructions with maximal efficiency, since the primary controller 201 would be able to dispatch a subinstruction to any subcontroller that is currently inactive. Also, if a specific subcontroller should become unavailable for any reason (e.g., hardware failure of the specific subcontroller), the primary controller 201 would nevertheless be able to effectuate completion of the testing of the memory device 122 so long as the remaining subcontrollers are collectively able to access all of the ports being utilized during the testing. Additionally, the testing apparatus 200a may include fewer subcontrollers than ports (e.g., S subcontrollers for testing a memory having N ports such that integer S<N). As an example of 2 subcontrollers and 6 ports, hardware interfacing between the 2 subcontrollers and the 6 ports may limit port access by the controllers to no more than 2 ports at the same time. As another example of 2 subcontrollers and 6 ports, hardware interfacing between the 2 subcontrollers and the 6 ports may be such that a first subcontroller of the 2 subcontrollers is hardwired to access a first set of three write-only ports, and the second subcontroller of the 2 subcontrollers is hardwired to access any of the remaining three ports.

One subcontroller can perform parallel identical operations upon a plurality of ports (e.g., a plurality of write-only ports) where the subcontroller's interfaces are coupled to all of the said plurality of ports. One subcontroller could be configured to perform a sequence of different operations upon different ports by providing the BIST with a port-interface time-multiplexing circuit, such that the subcontroller may perform operations on different ports at different times.

Each subcontroller may be designed to buffer one or more subinstructions derived from one or more instructions. The whole bank of N subcontrollers (i.e., the subcontrollers 210, 211, 212 . . . 21n), when each is loaded with a parallel executable subinstruction, has a capability of generating appropriate data and control signals in parallel to all N ports (i.e., the ports 510, 511, . . . , 51n) of the memory device 122. All subinstructions of an instruction may be buffered within, and executed serially by, a single subcontroller. To perform operations on the memory device 122 without allowing any idle cycles in a middle of a test, each subcontroller may store and execute a subinstruction until satisfaction of a terminating condition (e.g., last address of memory reached) for the executing subinstruction. To further optimize this process, each subcontroller may look several cycles ahead for the termination condition of the subinstruction execution loop. An address counter may be provided to each subcontroller to ensure that the loaded subinstruction is applied to all memory cells in the memory device 122. Each subcontroller would execute the next subinstruction upon occurrence of the terminating condition.

Although FIG. 2a shows the memory device 122 as multiported, the present invention also applies to multiple memory devices such that each memory device of the multiple memory devices has one port, as is depicted in FIG. 2b. FIG. 2b is a block diagram illustrating a BIST testing apparatus 200b for fault testing of N devices 610, 611, . . . , 61n via their respective ports 710, 711, . . . , 71n, in accordance with embodiments of the present invention. The devices (610, 611, . . . , 61n) may be memory arrays, or any other hardware having a digital interface. The subcontrollers 210, 211, . . . , 21n of the testing apparatus 200b are coupled to ports 710, 711, . . . , 71n of the devices 610, 611, . . . , 61n, respectively. Except for non-appearance in FIG. 2b of the instruction storage module 204 of FIG. 2a, which is assumed for FIG. 2b to be internal to the primary controller 201 as will be discussed infra in conjunction with FIG. 2c, the testing apparatus 200b of FIG. 2b is essentially the same as the testing apparatus 200a of FIG. 2a. Conceptually, the memory device 122 of FIG. 2a may be thought of as having its M memory addresses $A_1, A_2, \ldots, A_M$ divided into N address ranges with each address range including a contiguous subset of $A_1, A_2, \ldots, A_M$, such that the address ranges are non-overlapping and collectively include the M memory addresses $A_1, A_2, \ldots, A_M$. Each such address range has a functionality of a single memory device. Additionally, the scope of the present invention includes extending FIG. 2b to have a coupling of some or all of the subcontrollers 210, 211, . . . , 21n to some or all of the ports 710, 711, . . . , 71n. In consideration of the preceding discussion of memory addresses and coupling schemes relating to the N subcontrollers and the N ports in FIG. 2b, all of the features and characteristics described supra for the testing apparatus 200a and the memory device 122 of FIG. 2a, as well as all features associated with FIG. 2c and FIG. 2d, to be discussed infra, are applicable to the testing apparatus 200b and to the memory devices 610, 611, . . . , 61n of FIG. 2b.

Figure 2C:
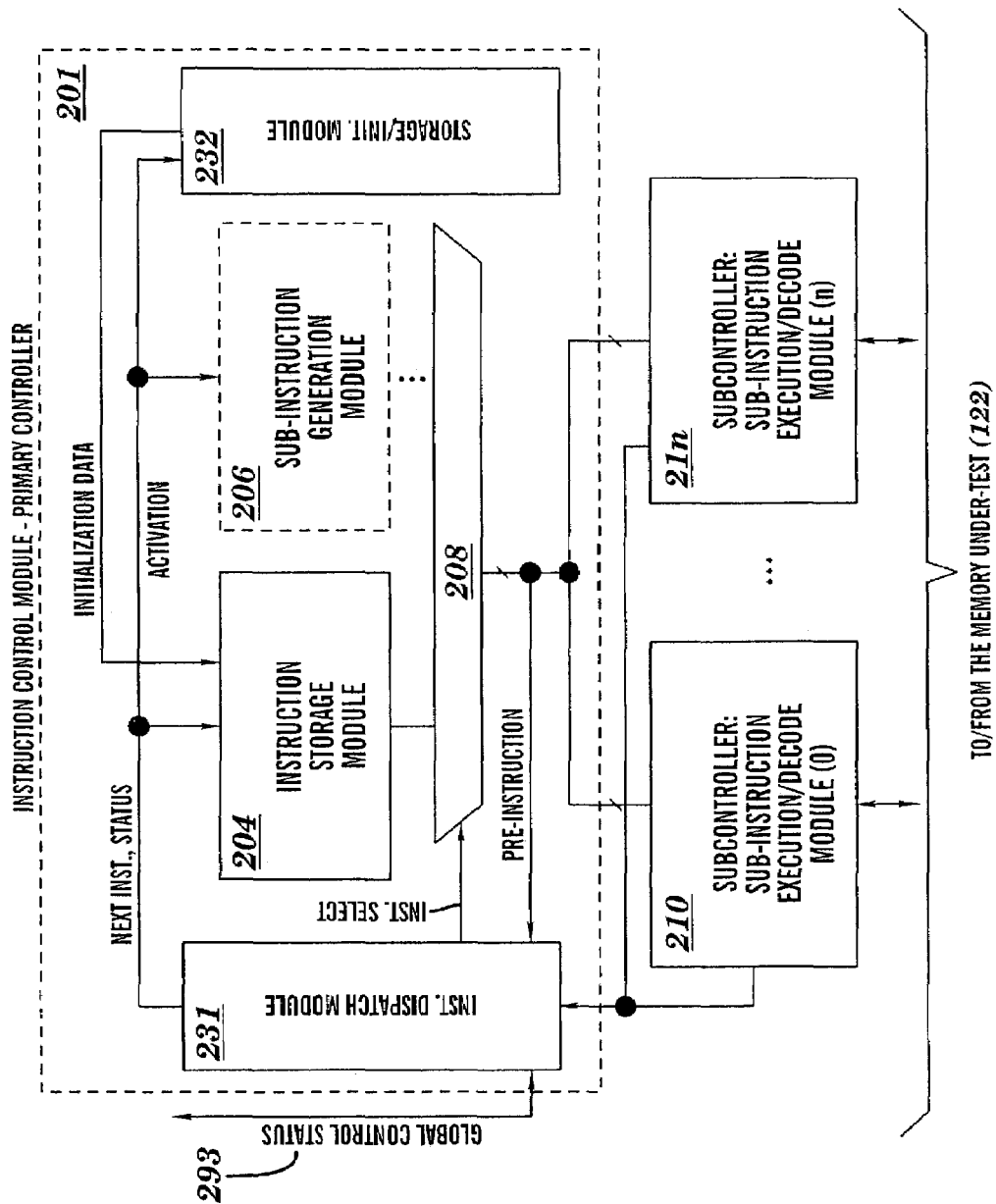
FIG. 2c illustrates internal functions of the primary controller of FIG. 2a or FIG. 2b.

FIG. 2c illustrates internal functions of the primary controller 201 of FIG. 2a or FIG. 2b. FIG. 2c represents an alternative embodiment to FIG. 2a, because the instruction storage module 204 in FIG. 2c is internal to the primary controller 201 in FIG. 2c, but is external to the primary controller 201 in FIG. 2a. Otherwise, all features of the primary controller 201 shown in FIG. 2c (to be explained infra) are likewise applicable to the primary controller 201 in FIG. 2a. As stated supra, the primary controller 201 in FIG. 2b assumes that the instruction storage module 204 is internal to the primary controller 201 such as is shown in FIG. 2c.

The primary controller 201 in FIG. 2c comprises the storage module 204, an instruction dispatch module 231, an initialization module 232, an instruction counter (not shown) to select the next instruction that should be executed, and a comparison data compression unit (not shown) to facilitate diagnostics.

The primary controller 201 may also include a subinstruction generation module 206 for internally generating predefined sets of subinstructions to be coordinated with particular instructions that implement specific memory test algorithms which are known prior to manufacture of the testing apparatus 200a or the apparatus 200b. Such particular instructions may activate the subinstruction generation module 206. The internally generated subinstructions from the subinstruction generation module 206 are not placed in the instruction storage module 204, but are transferred directly to the subcontrollers 210, 211, . . . , 21n. The subinstruction generation module 206 may comprise, inter alia, a table, a finite state machine, a ROM, or an externally accessible RAM or ROM.

As stated supra, the instruction storage module 204 (in either FIG. 2a or FIG. 2b) receives instructions either from an external source 203 (e.g., an external tester or an external memory device such as a RAM or ROM) of FIG. 2a or the initialization module 232 of FIG. 2c. The initialization module 232 may include, inter alia, an integrated ROM circuit, a detachably coupled ROM chip (e.g., EPROM), or a connected general purpose central processor unit (CPU). The instruction in the initialization module 232 may be hardware encoded or software generated within the initialization module 232.

A system for initializing a BIST is disclosed in detail in the related patent application Ser. No. 09/625996, entitled SYSTEM INITIALIZATION OF MICROCODE-BASED MEMORY BUILT-IN SELF-TEST, invented by same inventive entity as the present application and commonly assigned to International Business Machines Corp, which is hereby incorporated by reference.

The instruction dispatch module 231 controls the flow and execution of instructions and subinstructions stored in the instruction storage module 204. Selection by the primary controller 201 of the next instruction to be executed may be achieved by using an instruction counter, and/or a look-up table (or other circuit or device as known to one of ordinary skill in the art) to specify to the instruction storage module 204 the addresses of the instructions to be executed for testing the memory device 122. Additionally, the instruction dispatch module 231 may be used to initialize the instruction storage module 204 by directly passing to the instruction storage module 204 instruction input received externally (e.g., from a external test data port 293 in FIG. 2c or from the external source 203 in FIG. 2a), or by activating the initialization module 232.

Figure 2D:
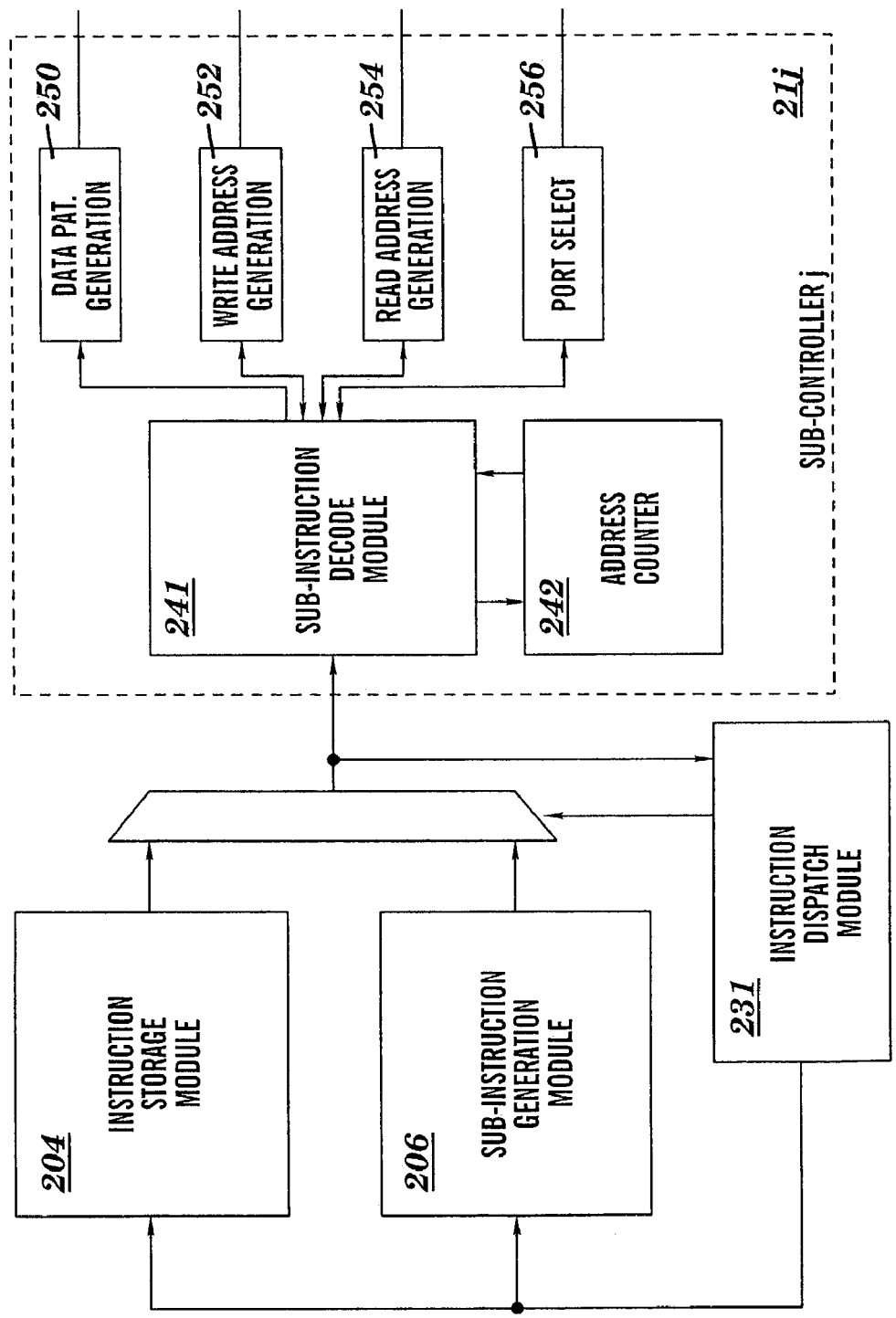
FIG. 2d illustrates internal functions of a subcontroller of FIG. 2a or FIG. 2b.

FIG. 2d depicts internal functions of the subcontroller 21j (k=0, 1, . . . , n) of FIG. 2a or FIG. 2b. The scope of the present invention allows integration of address generation modules (e.g., address generation modules 252 and 254) and data generation modules (e.g., data generation module 250) within the subcontroller 21j.

Figure 3A:
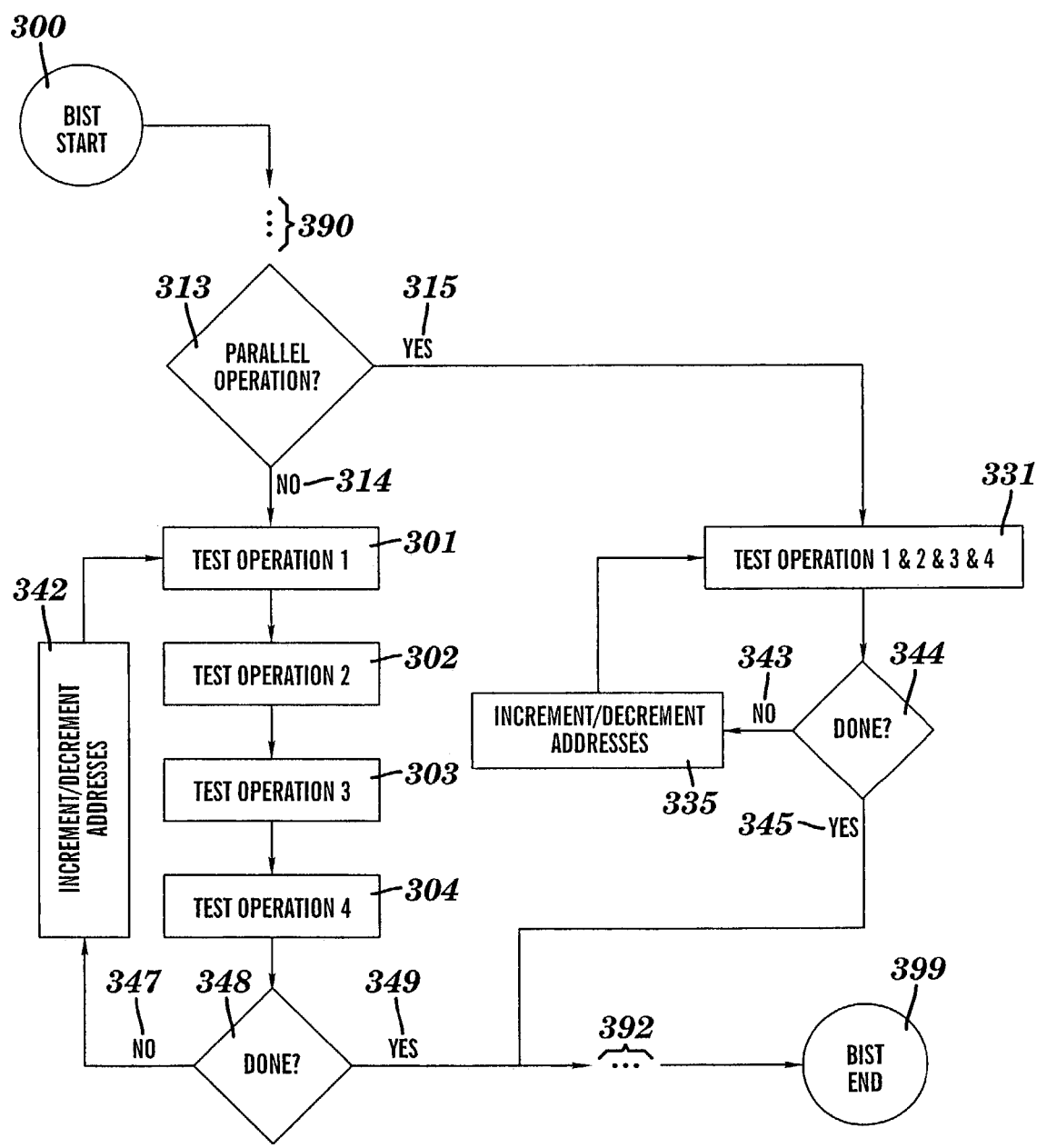
FIG. 3a is a flow diagram illustrating serial and parallel execution of subinstructions, as managed by the primary controller of FIG. 2a or FIG. 2b.
Figure 3B:
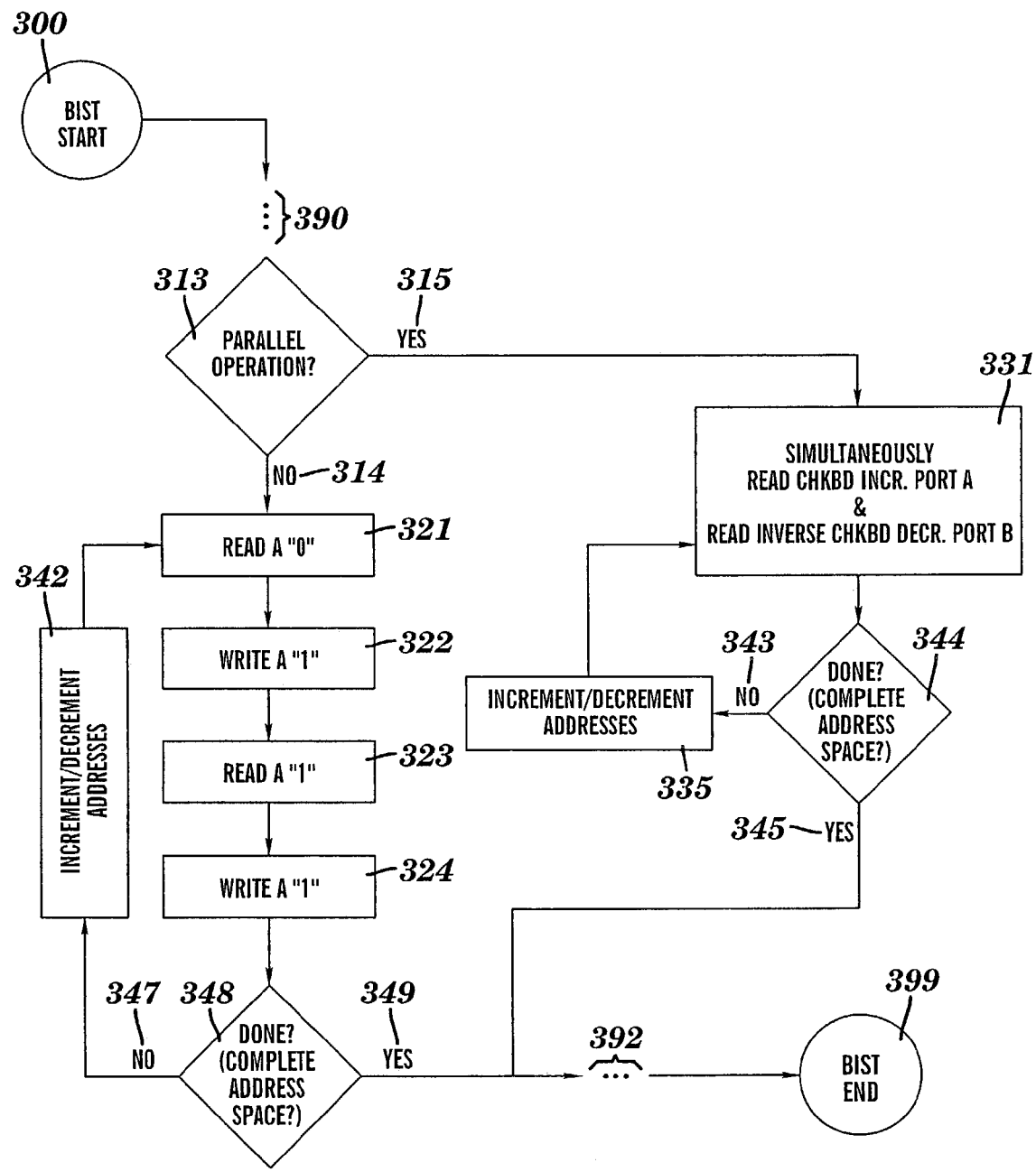
FIG. 3b is a flow diagram illustrating serial and parallel execution of subinstructions at two memory ports, as managed by the primary controller of FIG. 2a or FIG. 2b.
Figure 3C:
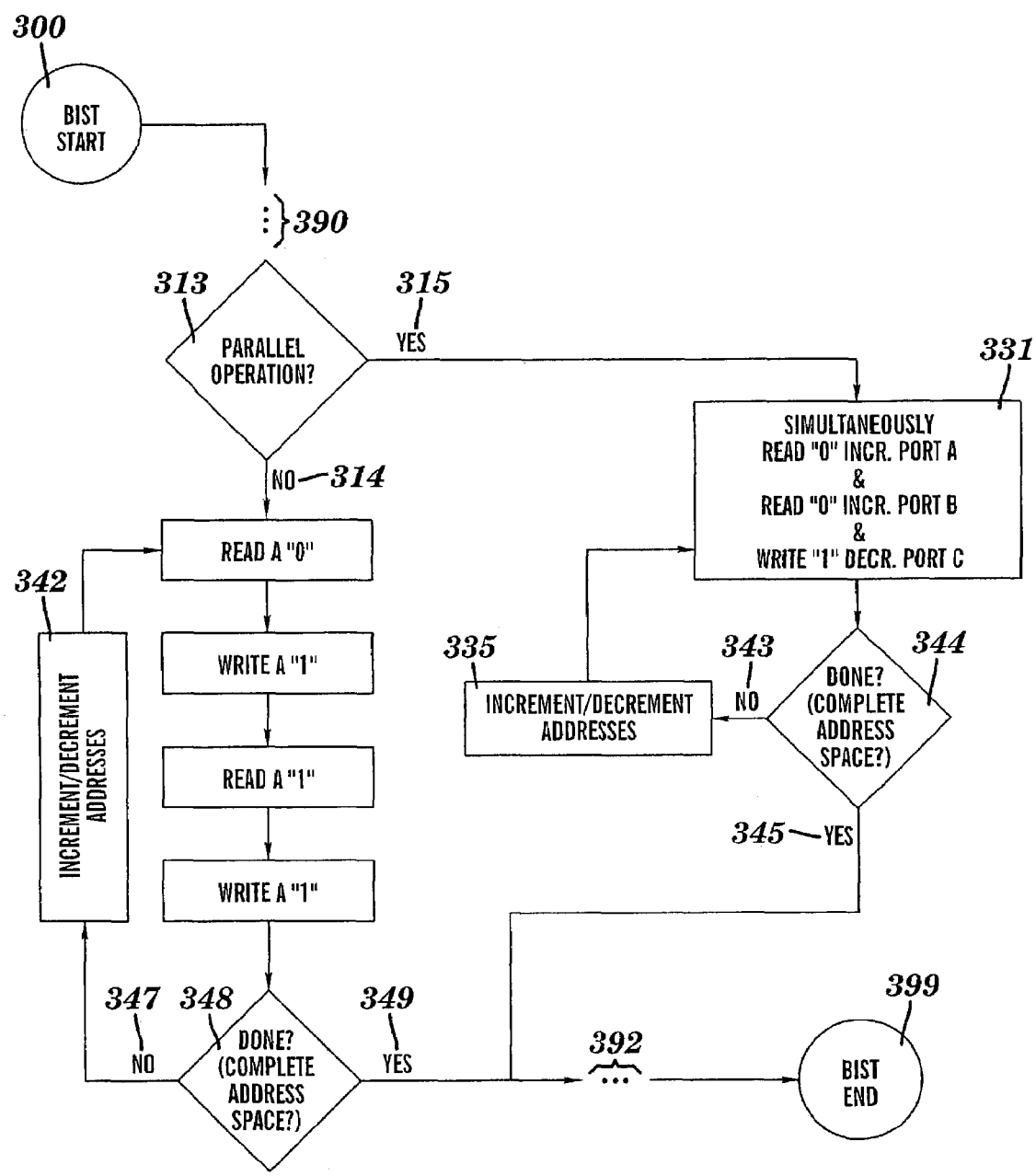
FIG. 3c is a flow diagram illustrating serial and parallel execution of subinstructions at multiple memory ports, as managed by the primary controller of FIG. 2a or FIG. 2b.

FIGS. 3a, 3b, 3c are flow diagrams illustrating serial and parallel execution of subinstructions at memory device ports, as managed by the primary controller 201 of FIG. 2a or FIG. 2b.

FIG. 3a is a flow diagram illustrating serial and parallel execution of subinstructions at four memory device ports. In FIG. 3a, "BIST Start" (300) denotes initiation of processing the first instruction 390 by the primary controller 201. After the first instruction 390 is processed, the next instruction 392 is processed. Item 392 generally denotes selection of the next instruction to be processed. After all instructions have been processed, the procedure ends as denoted by "BIST End" (399).

The illustrated instruction being processed in FIG. 3a includes 4 subinstructions (i.e., subinstruction j; j=1, 2, 3, 4). Execution of the subinstruction j requires implementing a Test Operation j (j=1, 2, 3, 4) over all M memory addresses $A_1, A_2, \ldots, A_M$. A Test Operation may include, inter alia, a writing or reading data bits through the ports 510, 511, . . . , 51n of FIG. 2a or FIG. 2b. As depicted in a query within a decision box 313 of FIG. 3a, the subinstructions j and associated Test Operations j (j=1, 2, 3, 4) are executed either in series along branch 314 (for a "No" response to the query) or in parallel along branch 315 (for a "Yes" response to the query).

FIG. 3a shows a serial execution of subinstructions j and associated Test Operations j (j=1, 2, 3, 4) by performing all 4 Test Operations on a first set of memory address $A_1$, followed by incrementing or decrementing (342) each of the addresses within the first set of memory addresses to form a second set of memory addresses; and performing all 4 Test Operations on the second set of memory addresses $A_2$, and repeating (incrementing or decrementing, etc.) through the whole memory space, as shown by the sequence 301-302-303-304-348-342 in FIG. 3a. Alternatively, said serial execution could be implemented by performing the Test Operation 1 on all M memory addresses ($A_1, A_2, \ldots, A_M$), followed by performing the Test Operation 2 on all M memory addresses, and repeating in such manner for Test Operations 3 and 4. Accordingly, all 4 subcontrollers may share the same address counter(s) such that the addresses exercised may be incremented or decremented alike (see step 342) for all 4 subinstructions.

For the serial execution depicted through branch 314 of FIG. 3a, the 4 Test Operations specified in the 4 subinstructions are performed at different times, one after the other, such that: performance of one instance of Test Operation 1 (301) is completed at a single address before performance of one instance of Test Operation 2 (302) is commenced at one address; performance of an instance of Test Operation 2 (302) is completed before performance of Test Operation 3 (303) is commenced; performance of an instance of Test Operation 3 (303) is completed before performance of Test Operation 4 (304) is commenced; performance of an instance of Test Operation 4 (304) is completed. Then address incrementing/decrementing is implemented (see step 342), and the Test Operations are repeated in series until all memory addresses have been tested.

FIG. 3b is a flow diagram illustrating serial and parallel execution of subinstructions at two memory device ports. In FIG. 3b, where two subinstructions are to be executed in parallel (i.e., "Simultaneously" 331), a first instance of the Test Operation 1 ("Read checkerboard increment at port A") is performed at the same moment in time that a first instance of the Test Operation 2 ("Read Inverse checkerboard decrement at port B") is being performed.

Steps 342 and 335 in FIG. 3b include "Increment/Decrement Address." "Decrement" implies: start at the top of the address space and decrement down to the bottom of the address space. "Increment" implies: start at bottom of the address space and increment up to the top of the address space. After a first instance of each Test Operation is performed in parallel, the address counter(s) of each subcontroller are incremented (343)/decremented and the next instance of both Test Operations is performed. The cycle repeats until the entire address space has been operated upon via both ports (DONE=YES). Then any next instructions are executed (392), until "BIST End" 399.

FIG. 3c is a flow diagram illustrating serial and parallel execution of subinstructions at multiple memory device ports. FIG. 3c is similar to FIG. 3b, except that in the parallel branch 315 of FIG. 3c, three Test Instructions are executed in parallel (in FIG. 3b, two Test Instructions are executed in parallel); i.e., a first instance of each of Test Operation 1, Test Operation 2, and Test Operation 3, are performed simultaneously, before a next instance of each of the three Test Operations is performed.

Instruction Methods, Structures, and Formats

Figure 4A:
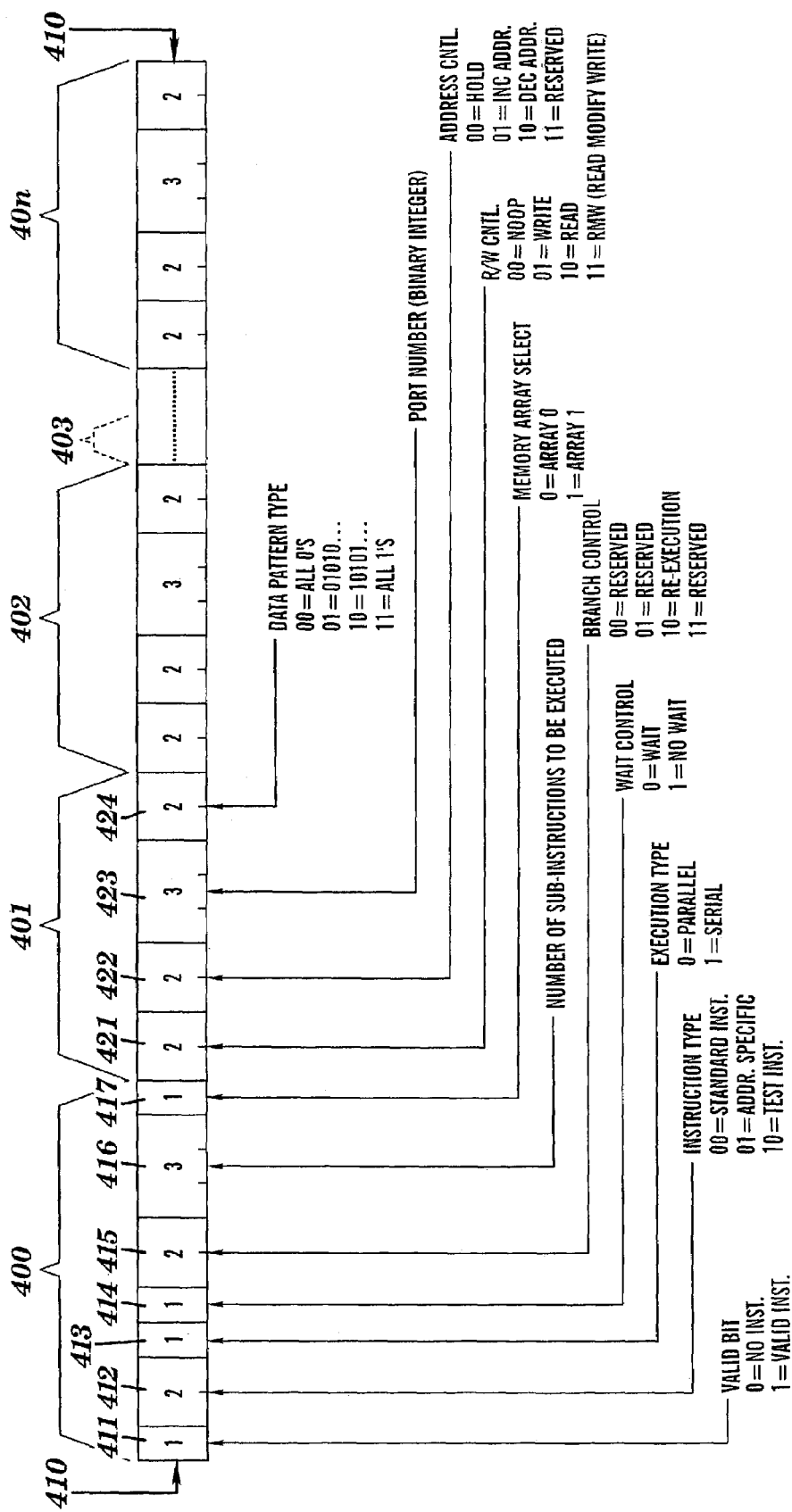
FIG. 4a is an embodiment of a standard-type microcode instruction as a word of binary bits having a preinstruction and a plurality of subinstructions, in accordance with embodiments of the present invention.

FIGS. 4a and 4b depicts exemplary methods, structures, and formats of instructions which may be used with the testing apparatus 200a of FIG. 2a and with the testing apparatus 200b of FIG. 2b, in accordance with embodiments of the present invention. The exemplary embodiments depicted herein comprise compact microcode instruction words of binary bits, in accordance with standard-type instructions, address-specific type instructions, and test-specific type instructions. All of the preceding instruction types are supported by BIST architecture.

A standard-type instruction may include a plurality of subinstructions which may be used to apply test operations (e.g., read/write data and control signals) to the entire memory space of a memory device having one or more ports. The standard-type instruction comprises one pre-instruction, provides space for a plurality of subinstructions, and may include a plurality of executable subinstructions. The standard-type instruction allows multiple subinstructions to be performed in series or in parallel at the ports of a multiported memory array. The parallel-operation feature facilitates testing for faults unique to multiported memories and enables a continuous series of operations to be applied to the memory device without interruption. Consequently, a weak memory cell is not allowed to recover and its failure is more reliably detected.

An address-specific type instruction is designed to execute one test operation with test data/control to be applied to one specific memory address location specified within the instruction.

A single test-specific type instruction executes a predefined sequence of test operations applied to the memory device, in implementation of an entire memory test algorithm. The test-specific type instruction is disclosed in detail in the related patent application Ser. No. 09/626,715, titled PROGRAMABLE MEMORY BUILT-IN SELF-TEST COMBINING MICROCODE AND FINITE STATE MACHINE SELF-TEST, invented by same inventive entity as the present application and commonly assigned to International Business Machines Corp, which is hereby incorporated by reference.

Each microcode word instruction is divided into a set of super-fields. The type of the instruction (i.e., standard-type, address-specific type, or test-specific type) determines the size and contents of each super-field. A diagram showing the arrangement of the superfields and fields within the standard-type instruction is provided in FIG. 4a.

FIG. 4a illustrates an embodiment of a standard-type instruction 410 as a configured word of binary bits. The standard-type instruction 410 comprises a preinstruction superfield 400 and at least two subinstruction superfields (e.g. 401, 402, 403, 404 . . . 40n). The pre-instruction superfield 400 comprises a plurality of fields (e.g., 411, 412, 413, 414, 415, 416, 417):

The first field (In/Valid) 411 in the pre-instruction 400 is one bit wide and specifies whether the instruction is valid (binary:1). Other schemes known to persons of ordinary skill in the art may be employed alternatively or additionally to indicate and/or confirm a valid instruction, including parity and other bit-error-detection protocols etc. Invalid microcode instructions (binary:0) may result in termination of testing of the memory space (e.g., the memory space 122 of FIG. 2a);

The second field (Instruction Type) 412 is two bits wide and distinguishes between standard (binary:00) , address specific (binary:01) and test specific (binary:10) instructions.

The third field (Execution Type) 413 specifies whether the subinstructions included within the microcode instruction shall be executed simultaneously (i.e., in parallel) (binary:0) , or sequentially (i.e., in series) (binary:1). The bit in the one-bit wide Execution Type field 413 specifies whether the other super-fields (i.e., containing subinstructions 401, 402, 403, . . . 40n) in the microcode instruction shall be executed in parallel (binary:0) or in series (binary:1); The Execution Type, being either serial or parallel, may be specified in one unit of information, called a "bit of information". A bit of information may be contained within one discrete binary bit, or may be distributed or encoded or encrypted within a plurality of binary bits, such as a contiguous field of binary bits, or even a noncontiguous set of binary bits.

The fourth field (Wait Control) 414 indicates whether the memory BIST unit shall wait (binary:1) for a pre-defined number of clock cycles prior to execution of the next microcode instruction;

The fifth field (Branch Control) 415 of the pre-instruction allows an infinite or finite number of re-execution(s) of the currently loaded microcode instruction. The first bit (MSB) of this field indicates if the address of the current microcode instruction should be saved (binary:1) (e.g., in a instruction counter shadow register); and the second bit (LSB), if set to (binary:1) , directs the instruction counter to branch to the instruction address saved in the shadow registers. If both bits of the branch control field are set (binary:11), then the operations in the loaded instruction will be repeated until all predefined branch conditions are satisfied;

The sixth field (Number of Subinstructions to be Executed) 416 is two or more (e.g., 3) bits wide and specifies the number of subinstructions in the standard instruction to be executed. A sixth field bit width of 2, 3, and 4 bits accommodates up to 3, 7, and 15 subinstructions, respectively. This field could be eliminated with appropriate modifications to hardware if each subinstruction were provided with a valid/invalid subinstruction flag bit or in case of serial execution a "last-instruction" flag bit. A zero value within this field may be defined as a NOOP or as a direction to wait for a predefined number of cycles;

The seventh and last (Memory Array Select) 417 field is used to select (e.g., through multiplexing) one of any plurality of multiported memory arrays (e.g. multiple copies of a multiported memory array, or memory arrays of different port-configurations or types) to be tested. This field is may be used to minimize the number of subinstructions and subcontrollers provided in an on-chip embodiment of the inventive BIST. This field, if used, is at least 1-bit wide, specifies the active memory-under-test, and operates in conjunction with appropriate multiplexing hardware. This field can be dispensed with or modified if it is necessary to exercise one port of each of the plurality of multiported memory arrays at the same time. This functionality may be secured by providing each port of each of said plurality of multiported memory arrays with a unique port-number, and by providing a sufficient number of subcontrollers as well as a sufficient number of subinstructions in the instruction words.

Any additional and alternative superfields and bit-definitions within fields may be provided or substituted, as is known by persons of ordinary skill in the art, if supported by appropriate hardware. The pre-instruction and each subinstruction may be included in exclusive bit regions of the microcode word, referred to herein as super-fields. In the case of standard instruction, in the embodiment of FIG. 4a the first super-field is 11-bits wide and is identified as the preinstruction 410.

FIG. 4b illustrates eight exemplary microcode instruction words in accordance with embodiments of the standard-type instruction of FIG. 4a. The eight exemplary microcode instruction words are identified as Lines (1), (2), . . . (8). FIG. 2b is divided into 4 sections as shown: section 910, section 912, section 920, and section 922. The exemplary microcode word shown in line (2) of section 910 carries a valid standard instruction that includes a preinstruction and 4 subinstructions to be executed in series. The pre-instruction 400 is eleven bits wide and consists of 7 fields. The first one bit field 411 in the pre-instruction specifies that the microcode instruction (word) is valid (binary:1). The second field 412 is two bits wide and specifies that the microcode instruction is a standard (binary:00) instruction. The third field 413 of the preinstruction is one bit-wide and specifies that the manner of execution of its associated subinstructions shall be in series (binary:1). The fourth field 414 is one bit wide and indicates that the memory unit does not have to wait (binary:0) after execution of the present microcode instruction for a pre-defined number of clock cycles prior to execution of the next microcode instruction. The fifth field 415 is two bits wide and specifies that there will be no re-execution (binary:00) of the present microcode instruction. The three-bit wide sixth field 416 specifies that four (binary:100) subinstructions contained in the standard instruction shall be executed. The seventh field 417 specifies that the microcode instruction (and all of its subinstructions) shall be executed upon the ports of memory array 1 (binary: 1).

In addition to the pre-instruction, each standard type microcode word contains a plurality of super-fields adapted to contain a plurality (e.g., 4 in a four-ported memory) of executable subinstructions (e.g. 401, 402, 403 . . . 40n). Each subinstruction super-field contains a plurality of fields to control the hardware operation of the subcontroller it is directed to. The first field 421 of each subinstruction is 2-bits wide and indicates the type of operation (e.g., Read/Write) that shall be applied to the specified port of the memory-undertest 122. A bit string (binary:00) in this field indicates that no Write/Read operation (i.e., NOOP) should occur at the specified port of the memory device (e.g., the memory device 122 of FIG. 2a). Bit strings (binary:01) and (binary: 10) specify Write-only and Read operations respectively (comparisons are performed implicitly with Read operations) The bit string (binary:11) allows consecutive Write and Read operations (e.g., read-modify-write: RMW). The definitions of the binary strings, 00, 01, 10, 11 could be restructured in any manner that would preserve the aforementioned functionality (e.g., binary 00 could indicate Read, and binary 11 could indicated Write-only, etc). The second field 422 controls the state of the memory address generation after each Read/Write: hold (binary:00); increment (binary: 01); decrement (binary:10); or special increment (binary: 11). In special increment, the specified operation is repeated a pre-defined number of times on the same address location prior to incrementing the address counter 242 or address generation module(s) 252, 254. The next field 423 is used to specify the port of a multiported device (i.e., a multiported memory) and determines the active port or the port to be tested. Similarly, the last field 424 of each subinstruction determines the type of data pattern to be generated: blanket zero (binary:00), checkerboard (binary:01) reverse-checkerboard (binary:10) and blanket one (binary:11).

Additional fields and/or bits can be provided in various embodiments to enable further or alternative read-write test data patterns. If the independently programmable functionality (e.g. independent address increment/decrement, or independent data type generation) of the plurality of subcontrollers is unnecessary in a given application, then the bit-spaces controlling such functionality(s) can be removed from the subinstruction superfields, and placed within the pre-instruction superfield, or set as a hardwired default, upon appropriate hardware modification. Alternatively, "DON'T CARE" fit patterns may be defined in fields within the subinstruction bit-space, such that a subinstruction containing a DON'T CARE bit pattern adopts the respective characteristic of a next subinstruction, or a preceding subinstruction.

The arrangement and organization of fields is optimized in the exemplary microcode structure (410) to facilitate bit-level programmability by human test-programmers in the field by providing them with an intuitive and learnable field and bit-space organization. Alternatively, automatic microcode compilers could be developed by skilled programmers to enable the microcoding of each desired test algorithm using higher-level language, such as for example the pseudo-code exemplified in sections 910 and 920 of FIG. 4b. The order, length and arrangement of each field in a microcode instruction and in each subinstruction is flexible but hardware-implementation dependent. Any field order could be rearranged by persons skilled in the art without departing from the scope of the disclosed invention. Similarly, bits within some or all fields could be rearranged or compressed or encrypted and/or decrypted in any logical manner, provided that hardware implementation logically follows the resultant bit-space definitions.

Sections 910 and 912 of FIG. 4b illustrate an example of serial instruction execution (note that "1" in field 413 denotes serial execution). In section 910, a set of 18 Test Operations implementing a variation on the March C memory test algorithm are arranged in six groups, wherein each group contains four (or fewer than four) Test Operations to be performed on the same port (port "<0>") of memory array "[1]". The <port number> and [memory array number] need only be specified once (until changed) in the higher-level language of section 910. In the higher-level code of section 910, the target port's number and target memory array's number are changed by subsequent "<>" or "[]" entries respectively. Address control in the higher level language is presumed to be "hold" unless a "+" or "inc" notation is specified for Increment, or unless a "−" or "dec" notation is specified for decrement. Each group of four or fewer Test Operations in section 910 is depicted situated across from a corresponding adjacent (machine language level) microcode instruction word of section 912.

Line (1) of section 910 directs a single subcontroller to Write "0"s (i.e., "00", meaning, All Zeros: field 424 value equals 00) beginning at the lowest address of the specified port <0> (field 423 value=000) and continue thereafter by "Inc"rementing the address and writing All Zeros and repeating the Writes to the addresses, until the entire address space of the port (i.e. all addresses accessible via that port) has been written to. More succinctly stated, zeros are written to every bit-cell in memory array 1 accessible via port 0.

The next line, Line (2) of section 910, directs that: a subcontroller shall Read from the lowest address of port 0 (and make a comparison with the specified and logically expected value zero) and continue thereafter by "Inc"rementing the address and Reading and repeating the Reads from the addresses until the entire address space of the port has been Read and compared to the specified (e.g., expected) value zero; then (by command of the second item in Line (2) of section 910) a subcontroller shall Write All Ones beginning at the lowest address of port 0 and continue thereafter by incrementing the address and writing All Ones and repeating the writes to the addresses until the entire address space of the port has been written to. The result, (Ones written to every bit-cell in memory array 1 accessible via port 0), is similar as in the result of Line (1) of section 910, because the Test Operation specified in this subinstruction was the same as was specified in the subinstruction of Line (1), except that the data to be written was "1s" rather than "0s"); then (by command of the third item in Line (2) of section 910) a subcontroller shall Read from the lowest address of the port 0 (and make a comparison with the specified and logically expected value One) and continue thereafter by Incrementing the address and Reading and repeating the Reads from the addresses until the entire address space of the port has been Read and compared to the specified (e.g., expected) value One; then (by command of the fourth item in Line (2) of section 910) a subcontroller shall Write All Ones beginning at the lowest address of port 0 of memory array 1 and continue thereafter by incrementing the address and writing All Ones and repeating the writes to the addresses until the entire address space of the port has been written to. The execution of Lines (3), (4), (5), and (6) are to be performed in the same sequential (series) fashion.

Sections 920 and 922 illustrate a simple checkerboard test algorithm employing a parallel (simultaneous) execution of two subinstructions. Line 8 of sections 920 and 922 illustrate an Example of Parallel Instruction execution. The exemplary standard-type microcode word expressed in binary notation (machine language) in line (7) of section 922 directs one subcontroller to execute the Test Operation specified in Line (7) of section 920 through the entire memory space (i.e., "+"=increment) via <port 0>. The exemplary standard-type microcode word expressed in binary notation (machine language) in line (8) of section 922 directs two subcontrollers to execute the two Test Operations specified in Line (8) of section 920 in parallel (i.e., each two instances of the Test Operations simultaneously) at <port 0> and <port 1>.

Each of the two standard-type microcode instruction words in section 922 contain a Execution-Type field (413) containing a binary "0" that specifies that all the subinstructions (within each microcode instruction) shall be executed in parallel (i.e., simultaneously) at the ports specified within the subinstructions. In practical hardware implementations, an instruction containing only one subinstruction may specify that this subinstruction shall be executed in series (e.g., Line 1) or in parallel (Line 7), but there may be little or no difference in the resulting physical execution of the subinstruction in each case.

In Line 8 of section 920, a set of two Test Operations are arranged in a group (contained in a microcode word), wherein the two Test Operations (i.e., Read data 10 decrement, and Read data 01 increment) are to be performed on different ports (i.e., <port 0>and <port 1>) of [memory array 1] in parallel. The two Test Operations in line 8 of section 920 are drawn across from a corresponding adjacent (machine language level) microcode instruction word of section 922 that implements such Test Operations.

Line (7) of section 920 and the corresponding microcode word in line (7) of section 922 direct a first subcontroller to Write a checkerboard pattern "0101010..." (e.g., field 424 value equals 01) beginning at the lowest address of the specified <port 0>(field 423 value=000) and incrementing (i.e., "+") the address until the entire address space of the <port 0> has been written to. More succinctly stated, line (7) directs that checkerboard data (i.e., "01010101") are written (from bottom to top) to every space in [memory array 1] accessible via <port 0>.

The pseudo code of Line (8) of section 920 and the corresponding microcode word in line (8) of section 922 direct:

1) a first subcontroller Reads and compares stored data "101010..." beginning at the highest address (i.e., "−" denotes start high and decrement down) of the specified <port 0> (field 423 value=000) and decrementing the address counter until the entire address space of the <port 0> has been Read and compared to the expected data value (an inverse checkerboard pattern "101010..."; field 424 value equals 10), while at the same time, 2) a second subcontroller Reads stored data "010101" (the checkerboard pattern) beginning at the lowest address of the specified <port 1> (field 423 value=001) and increments its address counter until the entire address space of the <port 1>has been Read and compared with the expected value "010101...". More succinctly stated, line (8) directs that the checkerboard data (previously written from bottom to top of the array memory address space) are to be expected and verified by simultaneous Read operations starting from top to bottom, and from bottom to top, at every space in [memory array 1] accessible via ports <0> and <1> respectively. (In alternative embodiments, depending upon the most convenient convention adopted, data "01" (stored at 424) may refer to a checkerboard pattern as defined by the first data in the lowest address space, wherein incrementing or decrementing will result in the same expected data pattern; or alternatively, "01" may refer to a the first two bits of a real-time data stream of a subcontroller, wherein incrementing will result in mapping the complement of the data pattern produced by decrementing on the memory array).

Embodiments of the invention therefore provide an improvement in flexibility by providing a multiport memory BIST based on compact microcode comprising subinstructions that can be executed either in parallel or serially. An embodiment of the inventive microcode BIST having N (where N is a positive integer) subcontrollers can be used to thoroughly test all N ports of a memory array or of each memory array of a plurality of memory arrays. An embodiment of the inventive microcode BIST having at least two but fewer than N subcontrollers, can still provide the basic serial/parallel testing function provided by the invention disclosed.

The inventive memory BIST module may be accessed (e.g., by external circuits and/or by testing equipment) and used to test embedded memory structures in manufacturing-level, board-level and system-level testing.

Figure 5:
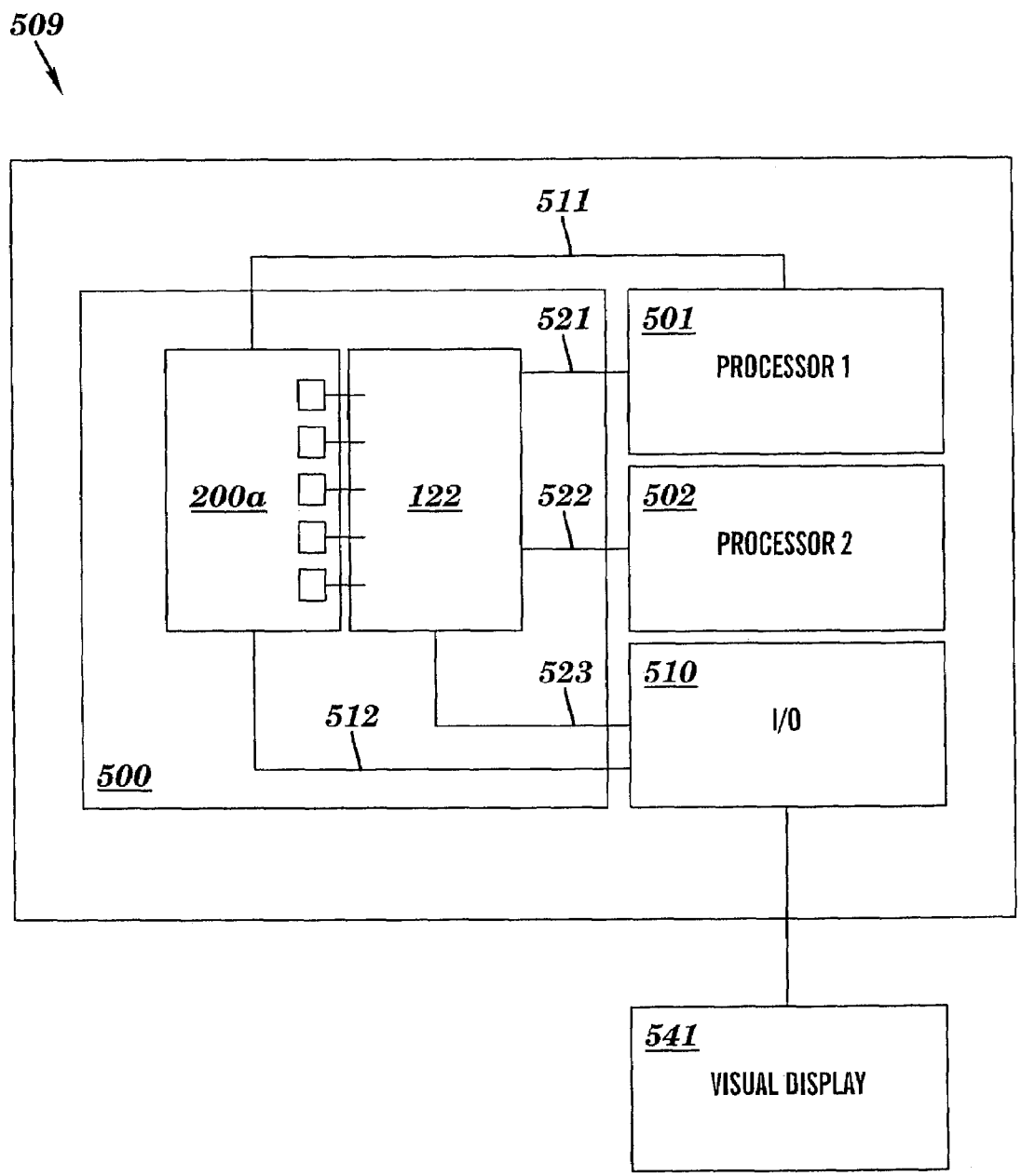
FIG. 5 depicts the testing apparatus of FIG. 2a, incorporated within an integrated circuit chip that is incorporated within a digital processor system, in accordance with embodiments of the present invention.

FIG. 5 depicts the testing apparatus 200a of FIG. 2a coupled to an N-Ported memory array 122, and incorporated within an integrated circuit chip 500 that is incorporated within an exemplary digital processor system 509, in accordance with embodiments of the present invention. The N-ported memory may be operatively coupled to the testing apparatus 200a in addition to one or more digital processors (e.g., 501, 502) and an input/output circuit (e.g., 510) via a plurality of interfaces (e.g. 521, 522, 523) coupled to the ports of the memory 122. The testing apparatus 200a may support system-level testing of the N-Ported memory 122, including power-on and/or boot-up memory testing. The testing apparatus may be coupled to a digital processor 501 (e.g., via connection 511) and/or to an input/output circuit 510 (e.g. via connection 512) to control the operation of the test apparatus and/or to report the results of the tests performed. The results of a test may be presented to the user on a visual display 541 coupled to or integrated within the digital processor system 509. The visual display may be a CRT Monitor, a flat-panel display, a Light-emitting-diode (LED), etc.

For board-level testing, the IEEE 1149.1 test methodology and its scan protocol may be used. Two Test Data Registers (TDR)s may be created from the storage elements in the memory BIST module. The first TDR contains all storage elements in the memory BIST module and may be accessed with the specified private instructions, load-mbist. The second TDR is accessed via run-mbist instruction and contains the storage elements in the memory BIST excluding the storage elements in the Microcode Instruction (word) Storage Module. The generated bit pattern may be loaded into the memory BIST module (e.g., the Subinstruction Generation Module) via Test Data Input (TDI) while the load-mbist instruction is loaded in the instruction register. The scan clocks in this mode are derived from the IEEE 1149.1 TCK clock. Once the memory BIST module is initialized, the run-mbist is loaded in the instruction register and the memory BIST is started to run at-speed using the on-chip oscillator. Memory testing is optimally performed at system speed (i.e., "at-speed").

In system-level testing, a central controller (e.g., a central processing unit) could be placed on the chip or in the system to initiate the memory BIST. In the system-level test, the central controller initializes and starts the memory BIST module. In this mode, the microcode instruction storage module may be flush initialized to a predefined memory test algorithm. This may be done by inserting appropriate inverters in the scan chain that defines the storage elements of the Microcode Instruction Storage Module as well as other components. Once the initialization is complete, the memory BIST module is started and the test patterns are applied to the memory-under-test. In the case of more than one port of the memory-under-test being tested by the inventive memory BIST, the system-level initialization sequence could enable testing all ports and memory structures in series or in parallel.

With the provision of external testing hardware that includes a high-level language compiler or an interpreter adapted to generate microcode in accordance with an embodiment of the invention, the (human) memory tester on the production floor could rapidly select a single term or phrase representing a whole memory test algorithm, for example "Enhanced March C", by a mnemonic such as "EMC", and thereby generate, load and/or execute all necessary microcode instructions in the BISTs of all memory-under-test that are in communication with such external testing equipment. The provision of high-level language control of the inventive BIST would enable human test operators who are not familiar with the details of the internal hardware structure (e.g., bit-space organization of microcode words), to perform testing in the shop floor, while the compact nature of the microcode continues to enable expert (bit-level) use and operation when required. Higher-level (e.g., mnemonic) BIST control would also provide machine-independence, such that an employee working in the industry familiar with the memory testing of one memory chip-design containing a first embodiment of the inventive BIST may rapidly switch to testing a second memory chip design containing a second (different) embodiment of the inventive BIST even though the microcode instructions may have a different bit-field layout. The development of an industry-wide standard set of mnemonics for implementing known memory test algorithms using embodiments of the inventive BIST would enhance the efficiency of all parties involved with the manufacture, design, testing, and end-use of memories and multiported memories.

During instruction execution, subcontrollers may report the outcome of the test of their memory structure-under-test as a pass/fail signal to the primary controller 201, or directly to any externally readable register(s). Each subcontroller may also report its status to the Primary Controller/Instruction Control Module (i.e., the primary controller). Detailed information about each failure within each memory structure-under-test can be captured in a pseudo-output of each subcontroller. Alternatively, pass/fail data can be collected and compressed and reported by compare and compression circuits outside of the subcontroller units.

With the addition of on-chip Radio-Frequency (RF) communications circuits on each chip or integrated circuit containing the BIST, the human field-tester could immediately perform simultaneous and touchless testing of a plurality of memory-under-test, by issuing a predefined high-level test directive (e.g., mnemonic "EMC"). Further, scripts comprising a sequence of high-level test directives, or even scripts of microcode word-level instructions could be made-up in advance (e.g., by memory IC manufactures) or in the field (by end-users) and immediately executed and/or saved for later use/reuse. The invention provides manufactures of multiported memory memories to provide their customers with predefined (ready-to-run) scripts of predefined test algorithms, while additionally providing a way to program and run additional custom tests using compact microcode, will enhance reliability and industrial productivity.

While the invention has been described in terms of specific embodiments, it is evident in view of the foregoing description that other alternatives, modifications, and variations will be apparent to those skilled in the state of the art. Thus, the invention is intended to encompass all such alternatives, modifications, and variations which fall within the scope and spirit of the invention and appended claims.

Appendix A: Exemplary Fault Modes and Memory Test Algorithms

The inventive BIST may be used to detect a plurality of fault modes, including the fault modes described below. Defects in memories may be due to shorts and opens in memory cells, address decoder(s), and read/write logic. These defects can be modeled as Stuck-at Faults (SAF), Transition Faults (TF), Stuck Open Faults (SOF), Address Decoder Faults (AF), Coupling Faults (CF), and Neighborhood Pattern Sensitive Faults (NPSF) in memory cells.

In multi-port memories, interaction of adjacent bit lines and interactions between address decoders of adjacent ports can be modeled as complex coupling faults (CCF). Certain fault modes are unique to multiported memories, including bit line and word line shorts across ports. In general, a bit line short across ports is any bridging fault that shorts a bit line of one port to a bit line of another port. Similar to bit line shorts, the most common inter-port word line shorts are word line shorts within the same row and between adjacent rows. Depending on memory structure hardware design, both types of word line shorts can occur.

Common tests performed when the device to be tested is an array of memory cells include a Marching (March) test, a Checkerboard test, or a Unique Address (Address-specific) test. In each case, the data retention in the cells is being checked. There are many other tests that may be performed. After each test is performed, a pass/fail result is passed from the BIST to the external circuit and/or external tester.

In an embodiment of the present invention, a plurality of Memory Test Types can be defined, with each performed by implementing a distinct Memory Test Algorithm developed or optimized for detecting particular failure mode(s). For example, a plurality of distinct Memory Test Types could be defined and differentiated as follows:

The Algorithm of Memory Test Type I implements an Enhanced March C- pattern on the entire address space of the memory via a single port to ensure correct functioning of the memory cells and address decoder of the singe port. Alternatively, a variation on the standard Enhanced March C pattern may be used, which is depicted in sections 910 and 912 of FIG. 4b. In an exemplary embodiment of the invention depicted in sections 910 and 912 of FIG. 4b, an Algorithm of Memory Test Type I is implemented by the execution of a set of six microcode instructions containing subinstructions that are physically executed in series (e.g., by one subcontroller) at one port <0>;

The Algorithm of Memory Test Type II implements an Enhanced Checkerboard pattern on the entire address space of the memory via a single port as a "burn-in" test. The burn-in test is generally required in manufacturing-level testing. Burn-in test requires the application of a checkerboard pattern to test any interaction between any two adjacent cells in the presence of changes in the external parameters such as temperature and operating voltage. The memory BIST controller can have the capability to stop at checkerboard patterns.

The inventive BIST can perform the algorithms of each of the forgoing Memory Test Types. It is believed that the inventive BIST can perform any test algorithm that may be performed by executing some combination of read and/or write operations at one or more ports of the memory device 122 (see FIG. 2a). Each of the subcontrollers 210, 212, 213 ... 21n (see FIG. 2a) has the ability to perform the necessary physical operations (e.g., Read, Write) at the port it is exercising, in accordance with each subinstruction it receives and/or decodes. The exemplary embodiment of the inventive programmable BIST at FIG. 2a can implement algorithm(s) of any or all of the forgoing Memory Test Types, since all of such algorithms can be carried out by the supported low-level operations such as Read and Write. Other algorithms may be defined and implemented by the inventive microcode BIST. The programable microcode BIST can implement different types of memory test algorithms beyond those listed as examples herein. This flexibility allows additional memory test algorithms or diagnostics patterns to be applied to the memory BIST unit without any design changes or modifications to the memory BIST unit hardware. Any algorithm that requires low-level physical operations other than, or in addition to, Read and Write can be implemented if the subcontrollers are provided with the hardware and interfaces sufficient to physically perform such operations at the ports of the device-under-test. Persons skilled in the art of digital circuit design would be readily able to design and/or modify the subcontrollers' I/O hardware, and the microcode instruction format and related execution hardware to adapt the inventive BIST to flexibly test any N-ported device of having known interface definitions.

We claim:

1. An apparatus for testing a device having a plurality of ports, the apparatus comprising:
    a plurality of subcontrollers, each subcontroller being adapted to execute a subinstruction of a plurality of subinstructions, each subinstruction directing a performance of at least one operation at one port of the plurality of ports, wherein each subinstruction includes a field indicating a type of operation, a field specifying memory address generation, and a field specifying a type of data pattern to be generated; and
    a primary controller coupled to the plurality of subcontrollers, the primary controller being adapted to dispatch the plurality of subinstructions to the plurality of subcontrollers.

2. The apparatus of claim 1, said plurality of subcontrollers being adapted to execute the plurality of subinstructions in series.

3. The apparatus of claim 1, said plurality of subcontrollers being adapted to execute the plurality of subinstructions in parallel.

4. The apparatus of claim 3, said plurality of subcontrollers being further adapted to execute the plurality of subinstructions in series.

5. The apparatus of claim 1, said primary controller being adapted to execute an instruction, said instruction adapted to contain a preinstruction and the plurally of subinstructions, said instruction being contained within a microcode word.

6. The apparatus of claim 5, said preinstruction including one bit of information controlling whether the plurally of subinstructions shall be executed In parallel or in series.

7. The apparatus of claim 5, said preinstruction including a binary bit denoting whether the instruction is valid or invalid.

8. The apparatus of claim 5, said preinstruction including at least one binary field selected from the group consisting of an Instruction Type Field, an Execution Type field, a Wait Control field, a Branch Control field, a Memory Array Select Field, and combinations thereof.

9. The apparatus of claim 5, said each subinstruction including a field of binary bits that specifies the one port of the plurally of ports.

10. The apparatus of claim 5, further comprising an instruction storage module for storing the instruction, said instruction storage module being coupled to the primary controller.

11. The apparatus of claim 10, said instruction storage module located within the primary controller.

12. The apparatus of claim 10, said instruction storage module being adapted to receive the instruction from a source that is external to the primary controller or from an initialization module within the primary controller, said initialization module being adapted to provide the instruction.

13. The apparatus of claim 10, said primary controller further comprising an instruction dispatch module adapted to control an order of execution of subinstructions of the plurality of subinstructions by the plurality of subcontrollers, said instruction dispatch module being coupled to the instruction storage module.

14. The apparatus of claim 1, said plurality of subcontrollers consisting of N subcontrollers such that N is an integer of at least 2, said plurality of ports consisting of N ports.

15. The apparatus of claim 1, said device including a memory, said testing including testing said memory, said at least one operation including at least one of a Read access to said memory and a Write access to said memory.

16. The apparatus of claim 1, said device coupled to the plurality of subcontrollers.

17. The apparatus of claim 1, said each subcontroller being adapted to execute its subinstruction by performing the at least one operation at the one port of the plurality of ports.

18. The apparatus of claim 1, said device including a memory, said memory including a plurality of memory addresses, said each subcontroller adapted to execute its subinstruction by performing the at least one operation at the one port of the plurality of ports at every memory address accessible to said each subcontroller via the one port.

19. A digital system, comprising:
a device having a plurality of ports;
a digital processor coupled to the device; and
an apparatus for testing the device, said apparatus comprising:
a plurality of subcontrollers, said plurality of subcontrollers coupled to the device, each subcontroller being adapted to execute a subinstruction of a plurality of subinstructions, each subinstruction directing a performance of at least one operation at one port of the plurality of ports, wherein each subinstruction includes a field indicating a type of operation, a field specifying memory address generation, and a field specifying a type of data pattern to be generated; and
a primary controller coupled to the plurality of subcontrollers, the primary controller being adapted to dispatch the plurality of subinstructions to the plurality of subcontrollers.

20. The digital system of claim 19, said device including a memory.

21. A method for testing a device having a plurality of ports, comprising the steps of:
providing a plurality of subcontrollers;
coupling a primary controller to the plurality of subcontrollers;
coupling the plurality of subcontrollers to the plurality of ports of the device;
dispatching by the primary controller a plurality of subinstructions to the plurality of subcontrollers; and
executing by the plurality of subcontrollers the plurality of subinstructions, each subinstruction directing a performance of at least one operation at one port of the plurality of ports, wherein each subinstruction includes a field indicating a type of operation, a field specifying memory address generation, and a field specifying a type of data pattern to be generated.

22. The method of claim 21, said executing step comprising executing said plurality of subinstructions in series.

23. The method of claim 21, said executing step comprising executing said plurality of subinstructions in parallel.

24. The method of claim 23, said executing step further comprising executing said plurality of subinstructions in series.

25. The method of claim 21, further comprising executing an instruction by the primary controller, said instruction containing a preinstruction and the plurality of subinstructions, said instruction being contained within a microcode word.

26. The method of claim 25, said preinstruction including one bit of information controlling whether the plurality of subinstructions shall be executed in parallel or in series.

27. The method of claim 25, said preinstruction including a binary bit denoting whether the instruction is valid or invalid.

28. The method of claim 25, said preinstruction including at least one binary field selected from the group consisting of an Instruction Type Field, an Execution Type field, a Wait Control field, a Branch Control field, a Memory Array Select Field, and combinations thereof.

29. The method of claim 25, said each subinstruction including a field of binary bits that specifies the one port of the plurality of ports.

30. The method of claim 25, further comprising coupling an instruction storage module to the primary controller, said instruction storage module being used for storing the instruction.

31. The method of claim 30, said instruction storage module located within the primary controller.

32. The method of claim 30, further comprising receiving the instruction by the instruction storage module from a source that is external to the primary controller or from an initialization module within the primary controller.

33. The method of claim 30, further comprising:
coupling an instruction dispatch module to the instruction storage module; and
controlling by the instruction dispatch module an order of execution of subinstructions of the plurality of subinstructions by the plurality of subcontrollers.

34. The method of claim 21, said plurality of subcontrollers consisting of N subcontrollers such that N is an integer of at least 2, said plurality of ports consisting of N ports.

35. The method of claim 21, said device including a memory, said testing including testing said memory, said at least one operation including at least one of a Read access to said memory and a Write access to said memory.

36. The method of claim 21, further comprising executing by each subcontroller its instruction including performing by each subcontroller its at least one operation at the one port of the plurality of ports.

37. The method of claim 21, further comprising executing by each subcontroller its instruction including performing by each subcontroller its at least one operation at the one port of the plurality of ports at every memory address accessible to said each subcontroller via the one port.

38. A method for testing a device coupled to a digital processor, comprising the steps of:
providing the device coupled to the digital processor, said device having a plurality of ports;
coupling a plurality of subcontrollers to the device; coupling a primary controller to the plurality of ports of the device;
dispatching by the primary controller a plurality of subinstructions to the plurality of subcontrollers; and
executing by the plurality of subcontrollers the plurality of subinstructions, each subinstruction directing a performance of at least one operation at one port of the plurality of ports, wherein each subinstruction includes a field indicating a type of operation, a field specifying memory address generation, and a field specifying a type of data pattern to be generated.

39. The digital system of claim 38, said device including a memory, said testing including testing said memory.

40. The apparatus of claim 1, wherein each of the plurality of subcontrollers comprises:
   an address generation module for accessing memory addresses of the device; and
   a data generation module for generating data patterns to be applied to the device.

41. The method of claim 21, further comprising executing two of said plurality of subinstructions in parallel wherein one of the subinstructions executed in parallel causes data to be read from the device by decrementing through a set of memory addresses of the device and the other one of the subinstructions executed in parallel causes data to be read from the device by incrementing through the set of memory addresses of the device.

* * * * *